United States Patent [19]

Schiebel

[11] Patent Number: 4,658,277
[45] Date of Patent: Apr. 14, 1987

[54] TWO LEVEL CHARGE IMAGING MATRIX DESIGN WITH STEPPED INSULATOR

[75] Inventor: Richard A. Schiebel, Dallas, Tex.

[73] Assignee: Texas Instruments Incorporated, Dallas, Tex.

[21] Appl. No.: 611,456

[22] Filed: May 17, 1984

[51] Int. Cl.[4] ............................................. H01L 29/78
[52] U.S. Cl. ...................................... 357/24; 357/32; 357/30
[58] Field of Search ................ 357/24, 24 LR, 53, 61, 357/30 B, 30, 32, 45; 358/113, 213; 250/578

[56] References Cited

U.S. PATENT DOCUMENTS

| | | | |
|---|---|---|---|
| 3,967,306 | 6/1976 | Bower | 357/240 |
| 4,194,213 | 3/1980 | Kano et al. | 357/30 X |
| 4,327,291 | 4/1982 | Chapman et al. | 357/30 X |
| 4,429,330 | 1/1984 | Chapman | 357/24 LR X |
| 4,447,291 | 5/1984 | Schulte | 357/30 X |

*Primary Examiner*—Martin H. Edlow
*Assistant Examiner*—Sara W. Crane
*Attorney, Agent, or Firm*—Carlton H. Hoel; James T. Comfort; Melvin Sharp

[57] ABSTRACT

The disclosure relates to a charge imaging matrix wherein the floating gate level closest to the substrate is used as a storage gate and the second floating gate level is used as both a field plate and a transfer gate due to the formation of a step in the insulator thereunder which leaves an N-channel in the transfer region when the remainder of the gate is biased to flat band.

21 Claims, 5 Drawing Figures

4,658,277

TWO LEVEL CHARGE IMAGING MATRIX DESIGN WITH STEPPED INSULATOR

BACKGROUND OF THE INVENTION

1. Field of the Invention

This invention relates to a charge imaging matrix (CIM) and, more specifically, to a charge imaging matrix utilizing only two gate levels.

2. Description of the Prior Art

Charge imaging matrix devices as produced in the prior art generally have three different gate levels. A gate level is defined herein as a semiconductor with insulator on a surface thereof in a layer and an electrically conductive gate level thereon followed by a further insulator layer. For three levels to exist a further gate level and a further insulator level and still a further gate level are provided, each gate level being separately deposited and electrically isolated from the remaining gate levels. Each metal level is a separate gate level and is separated from the adjacent gates by insulator as stated above. In accordance with the definition of a gate level as is used herein, a gate which is positioned at two different physical levels but deposited at one time is considered to be a single gate level.

A charge imaging matrix comprises three essential components, one being a detector gate which collects or senses charge that comes in and collects thereunder, the second being a diode and the third being a transfer gate between the detector gate and the diode which allows one to transfer charge which has been collected under the detector gate into the diode. This arrangement has required the three gate levels in the prior art as described above, one for the detector gate, one for the transfer gate and one for a field plate which solves a problem having to do with the surface of the HgCdTe semiconductor substrate.

In the currently used designs for a CIM cell utilizing the above described structure having three gate levels, all electrically independent, optically generated charge is collected under the detector gate. A surface channel is created under the transfer gate by biasing it to a weak inversion level. The well under the detector gate is collapsed, forcing the charge through the surface channel to the diode where it is sensed and drained. The transfer gate may be turned on only when charge transfer is desired. Alternatively, the transfer gate may be left on at all times if the well created thereunder is small compared to the size (depth into the material) of the well under the detector gate. The third gate in the structure is used simply for maintaining the rest of the surface of the semiconductor substrate at flat band and preventing unwanted surface channels.

The problem is that there is a fixed positive charge in the insulator which converts the surface of the semiconductor thereunder to a depletion area and causes a surface channel to exist. This requires the fabrication of the three gate levels as described. In the manufacture of charge image matrix devices of the prior art, the three gates have been positioned relative to the semiconductor material such that the field plate was closest thereto followed by the detector gate and then the transfer gate. Since the gate levels must be separated by an insulator level, it is apparent that the detector gate is not as close to the semiconductor surface as would be desirable since it is known that the farther the detector gate is from the semiconductor surface, the less charge storage capacity is available thereunder. It is also readily apparent that, with an increase in processing steps, the product yield must invariably suffer.

SUMMARY OF THE INVENTION

In accordance with the present invention there is provided a charge image matrix which overcomes the problems discussed hereinabove with respect to the prior art in that only two gate levels are utilized and the detector gate level or storage gate level is the lowest of the gates or closest to the semiconductor surface and can therefore be fabricated closer to the semiconductor surface than was available in the prior art, thereby maximizing the possible charge storage capacity thereunder.

Briefly, the basic concept behind the invention herein is the use of a stepped insulator to allow the functions of the transfer gate and the field gate levels to be combined into one gate level. By use of a stepped insulator, it is meant that the insulator thickness under a particular gate level is not the same at all points thereunder. Regions of different insulator thickness will have different surface potentials from the same gate to the substrate. In the design in accordance with the present invention, the detector gates are fabricated on the first or lowest gate level using conventional processing techniques. The diode may be formed prior to formation of the gates or it may be formed during a step subsequent to formation of the gate levels using a self-registration method as is known.

In the formation of the CIM in accordance with the present invention, preferably, assuming p-type HgCdTe semiconductor material is being used, an N-type doped region is formed extending to the surface of the substrate to provide the diode. Thereafter, a layer of zinc sulfide is deposited over the substrate followed by a patterned gate layer, such as nickel, in the event a transparent contact is desired or aluminum in the event an opaque contact is desired. This is followed by a further zinc sulfide layer which is then milled to provide a step thereon, the upper portion of the step being positioned in the region between the diode and the detector gate level, the lower portion of the stepped gate level being positioned over the diode and extending to the next detector gate level at the adjacent charge imaging matrix element. After formation of vias in known manner to each of the gates, indium will be deposited over the topmost insulator level and pass through the vias to contact the appropriate floating gate level to provide a conductor from the gate levels to the exterior of the device.

The upper gate formed will serve as both the field plate and the transfer gate of the prior art type devices. The increased insulaton thickness under the transfer channel insures a more negative flat band thereunder in the semiconductor substrate. Hence, when this level is biased to flat band for regions outside the transfer channel, a shallow inversion layer will exist in the transfer region of the semiconductor material. As can be seen, the fabrication technique as disclosed hereinabove permits fabrication of detector gates at the lowest gate level, this being a significant improvement over current designs because it maximizes charge storage capacity. Furthermore, the combined functions of transfer gate and field plate into a single gate level significantly shorten the process required for fabrication compared to prior art designs and thereby are susceptible of higher yields.

DESCRIPTION OF THE PREFERRED EMBODIMENT

Figure 1A:
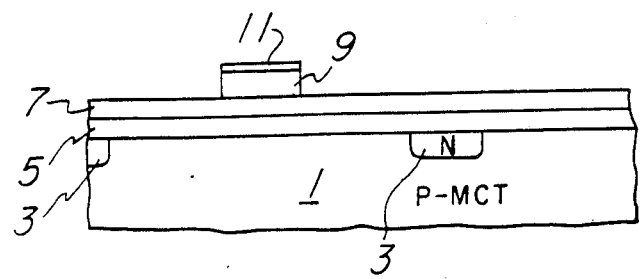
FIGS. 1A through 1E depict the processing steps required to provide a charge imaging matrix in accordance with the present invention.
Figure 1B:
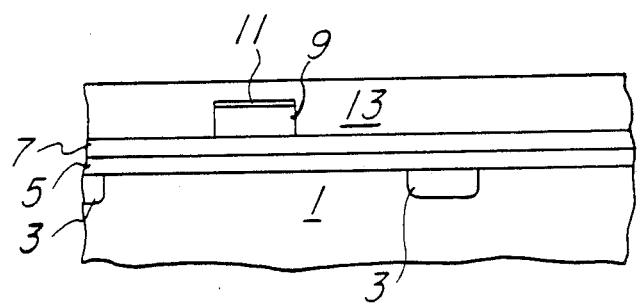
Figure 1C:
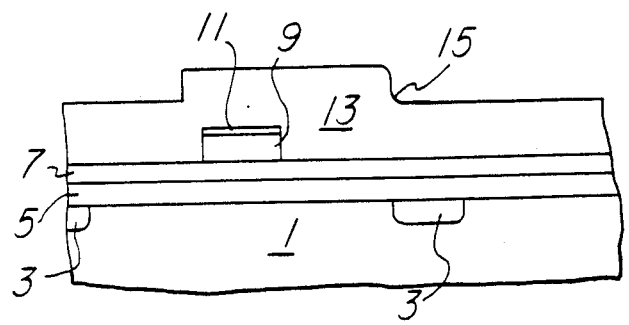
Figure 1D:
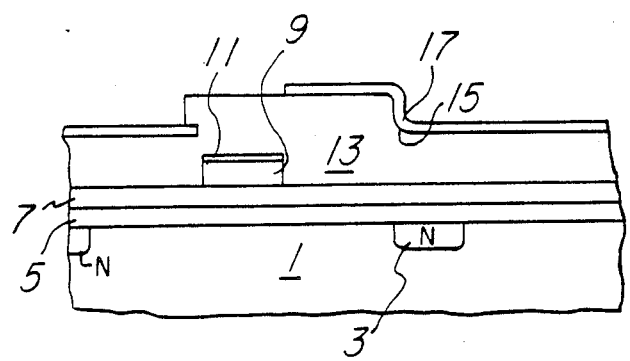
Figure 1E:
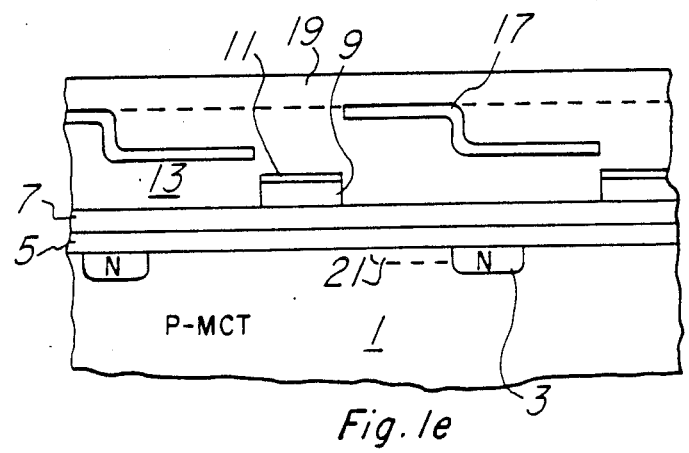

Referring now to the drawings, FIGS. 1A through 1E depict the processing steps required to provide the final charge imaging matrix as shown in FIG. 1E.

Referring first to FIG. 1A, the processing commences with a semiconductor substrate 1. A p-type HgCdTe (MCT) substrate will be utilized in the description herein thoughit should be understood that other types of semiconductor material as well as N-type substrates can be used as the substrate herein with appropriate alterations to the circuitry as is readily apparent to those skilled in the art. The P-type MCT substrate 1 has formed therein N-type regions 3 to form a diode in the substrate associated with each of the matrix elements. While the description herein shows the diode being formed in the substrate prior to the remaining processing steps, it should be understood that the diode could be formed subsequent to the processing steps to be described herein as well.

The diode is formed in standard manner by forming a native oxide 5 on the surface of the semiconductor material of about 800 angstroms, though this thickness is not critical, and then providing a photo mask through which a photoresist is deposited over the native oxide at the locations where the diodes are to be formed. An ion implant is then provided to form an N-type region at each unmasked area, boron being a typical ion implant material to form the diodes 3 as shown in FIG. 1A. The photoresist is then removed and a zinc sulfide insulating layer 7 is deposited over the native oxide having a thickness of about 1800 angstroms with the value not being critical, it merely being necessary that the insulating layers be sufficiently thick to prevent short circuiting between the metal gate 9, 11 to be deposited and the substrate. The surface of the insulator 7 is then patterned with an appropriate photoresist in known manner and electrically conductive layers 9, 11 is deposited. In the case of FIG. 1A, a nickel layer 9 is deposited which permits transmission of infrared radiation therethrough. An aluminum layer 11 of sufficiently thin dimension is formed atop the nickel layer to act as a via stop to stop via etching at that point when the vias will be formed later in the process but which will permit infrared radiations to pass therethrough. If desired, the entire contact can be formed of aluminum if infrared transmission is not required.

Referring now to FIG. 1B, an insulating layer of, preferably, zinc sulfide 13 is formed over the entire surface of the substrate to bury the floating detector contact formed of layers 9 and 11. The insulating layer 13 is then patterned with a photoresist to provide a pattern thereon which overlaps the edge of the detector gate 9, 11 and the edge of the diode 3. The insulating layer 13 is then milled in the region of overlap 15 with the diode 3 and therebeyond over the diode to overlap the adjacent detector gate to provide a two level insulator layer as shown in FIG. 1C. The photoresist is then removed and the surface of the device is then patterned in standard manner so that a further deposition of an opaque conductor 17, preferably aluminum, can be deposited so that it overlaps the edge of the detector gate 9, 11, bends at 15 from the upper level to the lower level over the edge of the diode 3 and then extends along the lower second gate level until it overlaps the edge of the following detector gate level. The photoresist is then removed and a further insulating layer 19, preferably zinc sulfide, is formed above the second floating gate level as shown in FIG. 1E above the dotted line. At this point, the processing will continue in standard manner whereby the zinc sulfide is etched to provide vias (not shown) extending from the upper surface of layer 19 to the detector gates 9, 11 and the field plate and the transfer gates 17 whereupon the etching will cease due to the existance of aluminum. Indium (not shown) will then be placed in the vias (not shown) to make contact from the gate levels to the surface of the matrix device in well known manner to provide the completed device.

In operation, with reference to FIG. 1E, a negative bias is placed on the detector gate 9, 11 to provide a depletion area thereunder in the substrate 1 but not sufficient as to neutralize all of the positive charge in the insulator layer 5. Under these conditions, electrons will collect in the well under the detector gate 9, 11 when infrared radiations bombard the semiconductor surface at the junction with the insulator 5. The transfer gate and field plate 17 is permanently biased to provide a flat band condition in the substrate 1 under the lower portion of gate 17 and to provide an N-channel beneath the higher portion of gate 17. This occurs due to the step in the gate 17. The bias voltage will depend upon the material used, the insulator thickness and other conditions.

When the bias on detector gate 9, 11 is made sufficiently negative, the electrons trapped in the well must move out and proceed to move through the N-channel 21 in the substrate 1 formed by the higher level of transfer gate 17 and is collected in diode 3 and causes a change of bias therein which is detectable in standard manner. The system is then reset by placing the original bias voltage on the detector gate 9, 11 for further electron accumulation thereunder.

It can be seen that there has been provided a charge image matrix which performs all of the functions of the prior art devices and yet avoids many of the problems inherent in prior art imaging charge imaging matricies.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:
1. A charge imaging matrix, comprising:
 (a) a doped semiconductor substrate;
 (b) a plurality of diodes in said substrate;
 (c) a first electrical insulator layer over a surface of said substrate extending over said diodes;
 (d) a first electrically conductive layer on a predetermined portion of said first insulator layer laterally spaced from said diodes;
 (e) a stepped second electrical insulator layer having a first region which is thicker than a second region thereof to form said step and disposed over said first electrically conductive layer and said first insulator layer, said stepped layer having said step disposed over an edge of said diodes;

(f) a second electrically conductive layer along said step extending at both ends thereof over said first conductive layer and electrically insulated therefrom; and (g) a third insulator over said second conductive layer.

2. A matrix as set forth in claim 1 wherein said first insulator layer is a native oxide of said semiconductor substrate material.

3. A matrix as set forth in claim 2 wherein said first insulator layer further includes a zinc sulfide layer over said native oxide.

4. A matrix as set forth in claim 2 wherein said first conductive layer is taken from the group consisting of nickel and aluminum.

5. A matrix as set forth in claim 3 wherein said first conductive layer is taken from the group consisting of nickel and aluminum.

6. A matrix as set forth in claim 1 further including vias in said second and third insulator layers extending from the surface of said third insulator to predetermined ones of said electrically conductive layers therebelow and electrically conductive material in said vias extending from said electrically conductive layers to the surface of said third insulator layer.

7. A matrix as set forth in claim 2 further including vias in said second and third insulated layers extending from the surface of said third insulator to predetermined ones of said electrically conductive layers therebelow and forming electrically conductive material in said vias extending from said electrically conductive layers to the surface of said third insulator layer.

8. A matrix as set forth in claim 3 further including vias in said second and third insulated layers extending from the surface of said third insulator to predetermined ones of said electrically conductive layers therebelow and forming electrically conductive material in said vias extending from said electrically conductive layers to the surface of said third insulator layer.

9. A matrix as set forth in claim 4 further including vias in said second and third insulated layers extending from the surface of said third insulator to predetermined ones of said electrically conductive layers therebelow and forming electrically conductive material in said vias extending from said electrically conductive layers to the surface of said third insulator layer.

10. A matrix as set forth in claim 5 further including vias in said second and third insulated layers extending from the surface of said third insulator to predetemined ones of said electrically conductive layers therebelow and forming electrically conductive material in said vias extending from said electrically conductive layers to the surface of said third insulator layer.

11. A matrix as set forth in claim 1 further including first biasing means to bias said second electrically conductive layer to a predetermined level to form a channel in said substrate below the higher portion of said step of opposite conductivity type as said substrate and to provide a substantially flat band region in said substrate under the remaining portions thereof.

12. A matrix as set forth in claim 2 further including first biasing means to bias said second electrically conductive layer to a predetermined level to form a channel in said substrate below the higher portion of said step of opposite conductivity type as said substrate and to provide a substantially flat band region in said substrate under the remaining portions thereof.

13. A matrix as set forth in claim 3 further including first biasing means to bias said second electrically conductive layer to a predetermined level to form a channel in said substrate below the higher portion of said step of opposite conductivity type as said substrate and to provide a substantially flat band region in said substrate under the remaining portions thereof.

14. A matrix as set forth in claim 4 further including first biasing means to bias said second electrically conductive layer to a predetermined level to form a channel in said substrate below the higher portion of said step of opposite conductivity type as said substrate and to provide a substantially flat band region in said substrate under the remaining portions thereof.

15. A matrix as set forth in claim 5 further including first biasing means to bias said second electrically conductive layer to a predetermined level to form a channel in said substrate below the higher portion of said step of opposite conductivity type as said substrate and to provide a substantially flat band region in said substrate under the remaining portions thereof.

16. A matrix as set forth in claim 6 further including first biasing means to bias said second electrically conductive layer to a predetermined level to form a channel in said substrate below the higher portion of said step of opposite conductivity type as said substrate and to provide a substantially flat band region in said substrate under the remaining portions thereof.

17. A matrix as set forth in claim 7 further including first biasing means to bias said second electrically conductive layer to a predetermined level to form a channel in said substrate below the higher portion of said step of opposite conductivity type as said substrate and to provide a substantially flat band region in said substrate under the remaining portions thereof.

18. A matrix as set forth in claim 8 further including first biasing means to bias said second electrically conductive layer to a predetermined level to form a channel in said substrate below the higher portion of said step of opposite conductivity type as said substrate and to provide a substantially flat band region in said substrate under the remaining portions thereof.

19. A matrix as set forth in claim 9 further including first biasing means to bias said second electrically conductive layer to a predetermined level to form a channel in said substrate below the higher portion of said step of opposite conductivity type as said substrate and to provide a substantially flat band region in said substrate under the remaining portions thereof.

20. A matrix as set forth in claim 10 further including first biasing means to bias said second electrically conductive layer to a predetermined level to form a channel in said substrate below the higher portion of said step of opposite conductivity type as said substrate and to provide a substantially flat band region in said substrate under the remaining portions thereof.

21. A charge imaging matrix, comprising
(a) a doped semiconductor substrate;
(b) a plurality of diodes formed at the surface of said substrate;
(c) a first electrically insulating layer on said surface;
(d) a first electrically conductive layer on a predetermined portion of said first insulating layer laterally disposed from said diodes; and
(e) a second stepped electrically conductive layer having electrically connected upper and lower levels electrically insulated from said first conductive layer, an end portion of said upper level and and end portion of said lower level being disposed over said first conductive layer, said step being disposed over an edge of said diode.

* * * * *